(12) United States Patent
Tsukada

(10) Patent No.: US 11,275,128 B2
(45) Date of Patent: Mar. 15, 2022

(54) MAGNETIC FIELD MEASURING DEVICE

(71) Applicant: NATIONAL UNIVERSITY CORPORATION OKAYAMA UNIVERSITY, Okayama (JP)

(72) Inventor: Keiji Tsukada, Okayama (JP)

(73) Assignee: NATIONAL UNIVERSITY CORPORATION OKAYAMA UNIVERSITY, Okayama (JP)

( * ) Notice: Subject to any disclaimer, the term of this patent is extended or adjusted under 35 U.S.C. 154(b) by 38 days.

(21) Appl. No.: 16/614,884

(22) PCT Filed: Mar. 30, 2018

(86) PCT No.: PCT/JP2018/013670
§ 371 (c)(1),
(2) Date: Nov. 19, 2019

(87) PCT Pub. No.: WO2018/211833
PCT Pub. Date: Nov. 22, 2018

(65) Prior Publication Data
US 2020/0110140 A1     Apr. 9, 2020

(30) Foreign Application Priority Data
May 19, 2017 (JP) .............................. JP2017-100227

(51) Int. Cl.
*G01R 33/035* (2006.01)
*G01R 33/00* (2006.01)
(Continued)

(52) U.S. Cl.
CPC ....... *G01R 33/035* (2013.01); *G01R 33/0082* (2013.01); *G01R 33/063* (2013.01); *G01R 33/07* (2013.01); *G01R 33/09* (2013.01)

(58) Field of Classification Search
CPC .......... G01R 33/5618; G01R 33/56545; G01R 33/56554; G01R 33/4818; G01R 33/5616; G01R 33/5611
(Continued)

(56) References Cited

U.S. PATENT DOCUMENTS 6,307,369 B1 * 10/2001 Felmlee ........... G01R 33/56509
324/307
9,279,863 B2    3/2016 Tsukamoto et al.
(Continued)

FOREIGN PATENT DOCUMENTS

JP      H01288722 A    11/1989
JP      H06194434 A    7/1994
(Continued)

OTHER PUBLICATIONS

Feng, Yejun, D. M. Silevitch, and T. F. Rosenbaum. "A compact bellows-driven diamond anvil cell for high-pressure, low-temperature magnetic measurements." Review of Scientific Instruments 85.3 (2014): 033901. (Year: 2014).*
(Continued)

*Primary Examiner* — Christopher P McAndrew
(74) *Attorney, Agent, or Firm* — Cantor Colburn LLP

(57) ABSTRACT

Provided is a magnetic field measuring device which has good temperature stability and which enables an improvement by making it possible for the sensitivity of a Hall element, a magnetic impedance (MI) element or a magnetic resistance (MR) element, which are conventionally used extensively, to be set freely. This magnetic field measuring device comprises: a temperature maintaining means for maintaining an extremely low temperature state in which a superconductor adopts a superconducting state; a magnetic sensor which is provided inside the temperature maintaining means to detect a magnetic field; and a magnetic field space
(Continued)

forming means for forming a magnetic field space specific to the superconducting state, by adopting a superconducting state inside the temperature maintaining means; wherein the magnetic sensor is disposed in the magnetic field space.

4 Claims, 7 Drawing Sheets

(51) Int. Cl.
    *G01R 33/06*     (2006.01)
    *G01R 33/07*     (2006.01)
    *G01R 33/09*     (2006.01)

(58) Field of Classification Search
    USPC .......................................................... 324/309
    See application file for complete search history.

(56) References Cited

U.S. PATENT DOCUMENTS

2006/0241390 A1*  10/2006  Kruger ............. G01R 33/56375
                                                          600/420

2012/0008842 A1*  1/2012  Hinks .............. G01R 33/56554
                                                          382/131
2015/0219730 A1   8/2015  Tsukamoto et al.
2017/0276755 A1*  9/2017  Hoge ................. G01R 33/5616

FOREIGN PATENT DOCUMENTS

| JP | 2010032368 A | 2/2010 |
| JP | 2011226819 A | 11/2011 |
| JP | 2013130471 A | 7/2013 |

OTHER PUBLICATIONS

International Search Report corresponding to Application No. PCT/JP2018/013670; dated Jun. 26, 2018.
Keiji Tsukada et al., "Absolute-magnetic-field measurement using nanogranular in-gap magnetic sensor with second-harmonic and liquid-nitrogen-temperature operation" AIP Advances, 7, 056670 (2017); 7 pages.
Yasuaki Matsunaga et al., "Application of HTS Coil With a Magnetic Sensor to Nondestructive Testing Using a Low-Frequency Magnetic Field", IEEE Transactions on Applied Superconductivity, 27, 1800304 (2017); 1 page.
JPO Notice of Reasons for Refusal for corresponding JP Application No. 2019-519100; dated Feb. 1, 2022.

* cited by examiner

MAGNETIC FIELD MEASURING DEVICE

CROSS REFERENCE TO RELATED APPLICATIONS

This application is the U.S. national stage of PCT/JP2018/013670, filed on Mar. 30, 2018, which claims priority under 35 U.S.C. § 119(a) and 35 U.S.C. § 365(b) to Japanese Patent Application No. 2017-100227, filed May 19, 2017, the contents of which are incorporated herein by reference in their entirety.

TECHNICAL FIELD

The present invention relates to a magnetic field measuring device using a magnetic sensor.

BACKGROUND ART

Various magnetic sensors are used according to various applications. There is a Hall element as a widely used magnetic sensor. The Hall element uses a Hall effect. A magnetic field acts on a current flowing in the element, and thus, an electromotive force generated in a direction perpendicular to a direction of the magnetic field is detected, and locality is measured. The Hall element is widely used for detecting a position of a rotating mechanism such as a motor and for an opening and closing switch of a mobile phone.

As a highly sensitive magnetic sensor, there is a magnetic impedance (MI) element. In the MI element, a phenomenon in which impedance when an amorphous alloy wire is driven by a pulse current is changed by a magnetic field is used.

As a magnetic sensor having excellent spatial resolution, there is a magnetoresistance (MR) element. This MR element is widely used for reading out magnetic recording digital data of a magnetic hard disk. The MR element uses a phenomenon in which resistance is changed with respect to the measured magnetic field, and various operating principles are proposed. A giant magnetoresistance (GMR) element, a tunnel magnetoresistance (TMR) element, or an anisotropic magnetoresistance (AMR) element is used depending on the operating principle.

Recently, the Hall element, the MI element, and the MR element are used not only for digital measurement but are often used as the highly sensitive magnetic sensor.

Meanwhile, when the Hall element, the MI element, and the MR element are used for analog measurement, various applications have been developed as a compass for measuring geomagnetism. As characteristics of the magnetic sensor for analog measurement, performance such as linearity in relation to a sensor output value corresponding to magnetic strength, a dynamic range which is a magnetic field strength range, and minimum resolution of the magnetic field capable of being measured is important. Thus, the magnetic sensors are developed in order to improve such performance.

Meanwhile, a superconducting quantum interference device (SQUID) is known as the most sensitive magnetic sensor compared to these magnetic sensors. This SQUID uses a superconducting phenomenon. In a SQUID using a low-temperature superconductor such as Nb, the superconductor is in a superconducting state by being cooled by liquid nitrogen. Since YBCO known as an oxide superconductor has a high superconducting temperature, this superconductor is used in the superconducting state by being cooled by liquid nitrogen. Since the SQUID is very sensitive, the superconductor is used in a device that inspects a very weak magnetic field generated by electrophysiological phenomena such as the brain and heart of a living body.

Sensitivity of the magnetic sensor operated at a room temperature such as the Hall element, the MI element, and the MR element and sensitivity of the magnetic sensor using the superconducting phenomenon such as SQUID are greatly different, and there is no magnetic sensor capable of measuring intermediate sensitivity thereof.

A problem that the SQUID can only periodically respond to the magnetic field is known. That is, in the SQUID, it is necessary to provide a circuit that cancels the measurement magnetic field in order to obtain a linear response to the magnetic field which is important as sensor characteristics. Accordingly, a relative magnetic field change can be measured with high sensitivity even in the SQUID, but an absolute magnetic field, that is, a zero point cannot be determined.

Meanwhile, the magnetic sensor operated at a room temperature is devised such that a sensor output with respect to the measurement magnetic field becomes a linear output, and can measure the absolute magnetic field. However, since there is a drift due to a temperature in such a magnetic sensor, temperature correction of a standard point or sensitivity is required.

Here, the present inventor has reported that the absolute magnetic field can be measured by eliminating the temperature drift and improving the sensitivity by cooling the magnetic sensor operated at a room temperature to a constant temperature by liquid nitrogen (See Non Patent Literature 1). Alternatively, the present inventor has reported a method of disposing a magnetic sensor on a superconducting coil surface as a method of combining a superconducting coil and a magnetic sensor. Here, a direction in which the magnetic sensor performs the measurement is perpendicular to the superconducting coil surface, that is, the same as a direction of the magnetic field detected by the superconducting coil (see Non Patent Literature 2). However, in this configuration, since the magnetic field being measured and the magnetic field generated by the shielding current are regarded as being in the same direction, there is a problem that sufficient sensitivity cannot be obtained due to the mixing of these magnetic fields.

CITATIONS LIST

Non-Patent Literature

Non Patent Literature 1: Keiji Tsukada, Takuya Yasugi, Yatsuse Majima, Kenji Sakai, and Toshihiko Kiwa, "Absolute-magnetic-field measurement using nanogranular in-gap magnetic sensor with second-harmonic and liquid-nitrogen-temperature operation" AIP Advances, 7, 056670 (2017)

Non Patent Literature 2: Yasuaki Matsunaga, Ryota Isshiki, Yuta Nakayama, Kenji Sakai, Toshihiko Kiwa, Keiji Tsukada, "Application of HTS-coil with a magnetic sensor to nondestructive testing using a low-frequency magnetic field", IEEE Transactions on Applied Superconductivity, 27, 1800304 (2017)

SUMMARY OF INVENTION

Technical Problems

Although the sensitivity can be improved by operating the magnetic sensor operated at room temperature at a low temperature, sufficient sensitivity cannot be obtained, and thus, it is necessary to measure the magnetic field with even higher sensitivity.

Solutions to Problems

The present invention provides a highly sensitive magnetic field measuring device, and the magnetic field measuring device includes temperature maintaining means for maintaining a very low temperature state in which a superconductor is in a superconducting state, a magnetic sensor that is provided within the temperature maintaining means to detect a magnetic field, and magnetic field space forming means for forming a magnetic field space specific to the superconducting state by causing the superconductor to be in the superconducting state within the temperature maintaining means. The magnetic sensor is disposed within the magnetic field space.

The magnetic field measuring device of the present invention has the following features.

(1) The magnetic sensor is disposed between first magnetic field space forming means and second magnetic field space forming means.

(2) The magnetic field measuring device includes a base having a slit which allows the magnetic sensor to be inserted, and the first magnetic field space forming means and the second magnetic field space forming means are provided with the slit interposed therebetween.

(3) The first magnetic field space forming means and the second magnetic field space forming means are integrated on the base.

(4) The magnetic sensor is any one of a Hall element, a magnetic impedance element, and a magnetoresistance element.

(5) The magnetic field space forming means is a superconducting coil, and the magnetic sensor measures a magnetic field generated by a shielding current generated in the superconducting coil.

(6) A normal conductor is interposed in a part of the superconducting coil.

Advantageous Effects of Invention

According to the present invention, it is possible to provide the magnetic field measuring device capable of measuring the magnetic field with higher sensitivity.

DESCRIPTION OF EMBODIMENTS

A magnetic field measuring device according to the present invention includes temperature maintaining means for maintaining a very low temperature state in which a superconductor is in a superconducting state, a magnetic sensor that is provided within the temperature maintaining means to detect a magnetic field, and magnetic field space forming means for forming a magnetic field space specific to the superconducting state by causing the superconductor to be in the superconducting state within the temperature maintaining means.

In particular, in the magnetic field measuring device of the present invention, the magnetic sensor is disposed in the magnetic field space specific to the superconducting state formed by the magnetic field space forming means.

Hereinafter, the description will be made while illustrating specific embodiments.

First Embodiment

Figure 1:
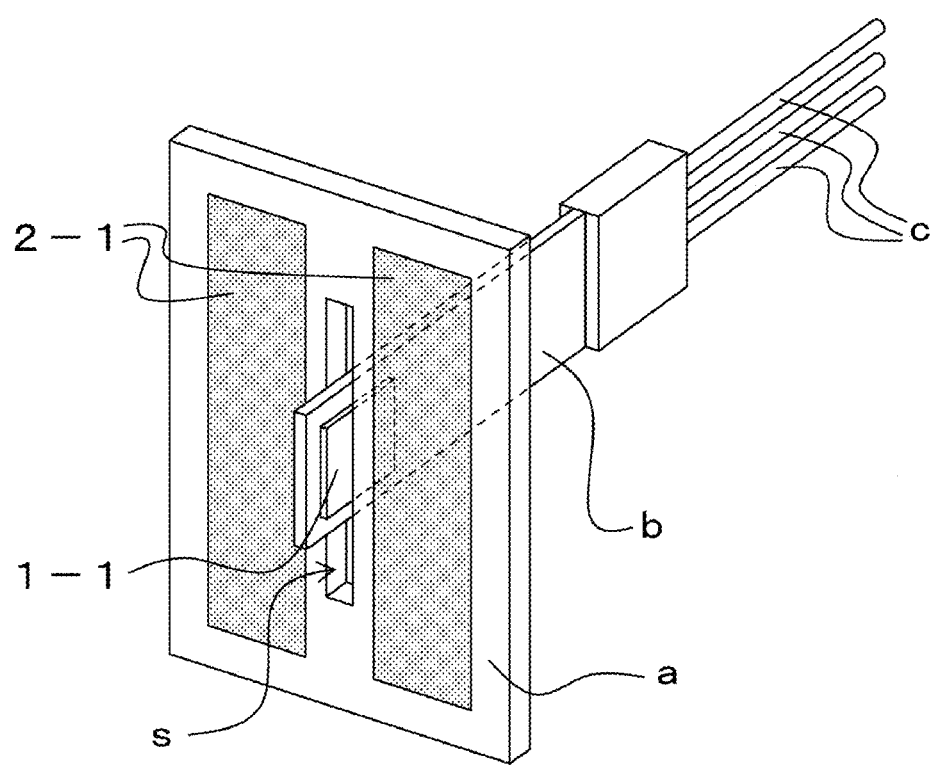
FIG. 1 is a schematic explanatory diagram of a main part of a magnetic field measuring device according to a first embodiment.

FIG. 1 illustrates a sensor unit that is a main part of a magnetic field measuring device according to a first embodiment. In FIG. 1, a reference sign 1-1 denotes a magnetic sensor, and a reference sign 2-1 denotes superconductors.

The magnetic sensor 1-1 may be any one of a Hall element, a magnetic impedance element, and a magnetoresistance element, and can be connected to a measurement circuit (not illustrated) to measure magnetism. The magnetic sensor 1-1 is disposed on an appropriate substrate b, and is connected to a measurement circuit (not illustrated) via a wiring c connected to the substrate b.

The superconductors 2-1 are magnetic field space forming means, and are formed by forming superconducting films on a surface of a plate-like support base a. More specifically, in the present embodiment, the support base a is a MgO substrate, and the superconductor 2-1 is formed by a yttrium-based YBCO thin film. As the superconductor 2-1, a copper oxide superconductor such as a bismuth superconductor or an iron superconductor may be used in addition to the yttrium-based superconductor, and a bulk body may be used instead of the thin film.

A magnetic field shielding effect is demonstrated by causing the superconductors 2-1 to be in the superconducting state, and a magnetic flux circulates around the superconductors due to this shielding effect. In the present invention, a space in which such a shielding effect is demonstrated is called a "magnetic field space specific to the superconducting state".

As illustrated in FIG. 1, a slit s into which the magnetic sensor 1-1 can be inserted is formed in the support base a. The magnetic sensor is immersed in a container in which liquid nitrogen is stored together with the support base a in a state in which the magnetic sensor 1-1 is inserted into the slit s, and thus, the superconductors 2-1 are in the superconducting state. In the present embodiment, the container in which the liquid nitrogen is stored is temperature maintaining means, and liquid helium may be stored instead of the liquid nitrogen depending on the kind of the superconductor 2-1 to be used. Alternatively, the superconductors 2-1 may be in the superconducting state by using an appropriate refrigerator.

As illustrated in FIG. 1, the superconductors 2-1 are provided on the surface of the support base a in which the slit s is formed, and form first magnetic field space forming means and second magnetic field space forming means by being opposed to each other with the slit s interposed therebetween. As stated above, two superconductors 2-1 are arranged so as to be close to each other with the slit s interposed therebetween, and thus, the magnetic flux is concentrated between two superconductors 2-1, that is, the slit s when the superconductors 2-1 are in the superconducting state. It is possible to strengthen the magnetic field to be measured due to the concentration of this magnetic flux, and it is possible to measure the magnetic field stronger than an actual magnetic field by measuring the strengthened magnetic field by the magnetic sensor 1-1. As a result, it is possible to substantially improve sensitivity. In particular, it is desirable that the magnetic sensor 1-1 is disposed in parallel with a direction of the magnetic flux passing through the slit s.

Figure 2:
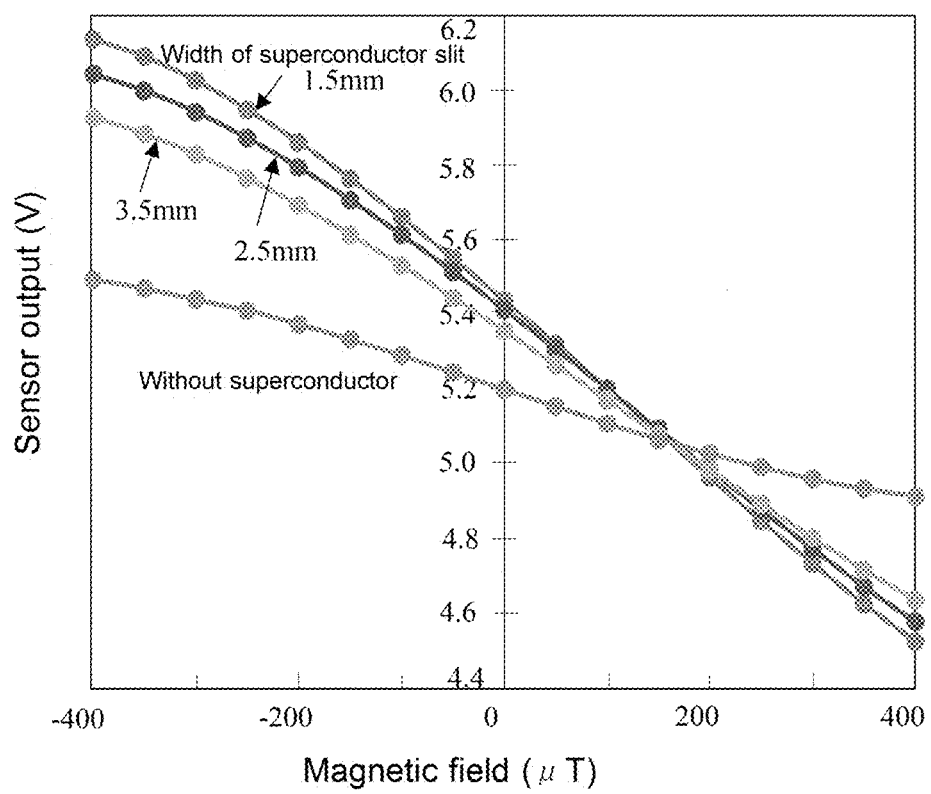
FIG. 2 is a graph representing magnetic field response characteristics when a slit interval is changed in the magnetic field measuring device according to the first embodiment using an AMR element as a magnetic sensor.

Each superconductor 2-1 in FIG. 1 has a rectangular shape having a length of 10 mm and a width of 5 mm so as to face on both sides of the slit s. FIG. 2 illustrates results of examining a change in sensitivity when a width dimension of the slit s is 1.5 mm, 2.5 mm, and 3.5 mm. Here, an anisotropic magnetoresistance (AMR) element is used as the magnetic sensor 1-1.

As illustrated in FIG. 2, it is apparent that sensitivity is higher in a case where the superconductors 2-1 are provided than in a case where the superconductors 2-1 are not provided. It is confirmed that the concentration of the magnetic flux becomes more intense as the width dimension of the slit s is narrowed and the sensitivity is improved. That is, the sensitivity can be freely adjusted by adjusting the width of the slit s.

Here, although the superconductors 2-1 are formed by the superconducting thin film formed on the surface of the plate-like support base a having the slits s as described above, two superconducting bulk bodies may be provided in parallel at an interval corresponding to the slits s. That is, the magnetic field measuring device in which the magnetic sensor 1-1 is disposed between these superconducting bulk bodies may be used.

Figure 3:
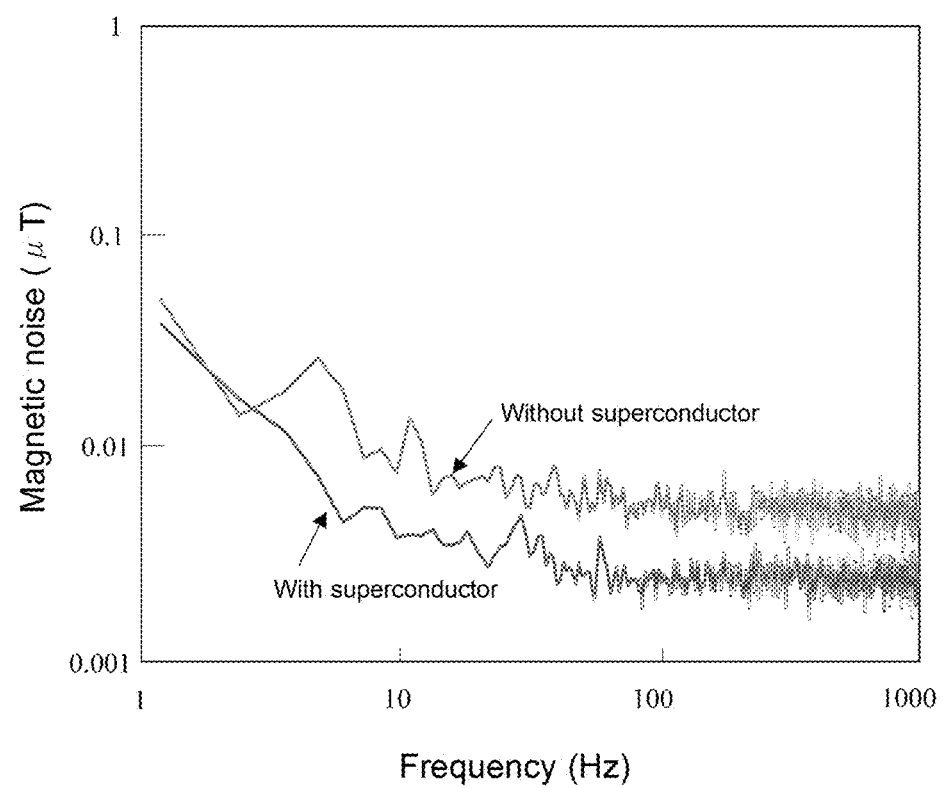
FIG. 3 is a graph representing a noise spectrum in the magnetic field measuring device of the first embodiment using the AMR element as the magnetic sensor.

In addition to the "sensitivity", there is "magnetic field resolution" as important characteristics of the magnetic field measuring device. In general, the "sensitivity" often includes the "magnetic field resolution", but the "sensitivity" is a conversion coefficient of a sensor output of the magnetic sensor 1-1 with respect to the magnetic field. Meanwhile, the "magnetic field resolution" indicates how small the magnetic field can be measured. Therefore, similar to the "sensitivity", the evaluation results of the "magnetic field resolution" are illustrated in FIG. 3. Here, an anisotropic magnetoresistance (AMR) element is used as the magnetic sensor 1-1.

FIG. 3 is a noise spectrum graph, and represents magnetic noise at each frequency. Since signals below the magnetic noise cannot be detected, the magnetic noise indicates the magnetic field resolution indicating the minimum magnetic field strength capable of being measured. Here, the width dimension of the slit s formed in the support base a is 1.5 mm, the magnetic noise at each frequency at the support base a at which the superconductors 2-1 in the superconducting state are provided and the support base at which the superconductors 2-1 are not provided. It is confirmed that the magnetic field resolution is improved by providing the superconductors 2-1. From this result, it is confirmed that not only the sensitivity but also the magnetic field resolution can be improved by combining the superconductors 2-1 and the magnetic sensor 1-1.

Figure 4:
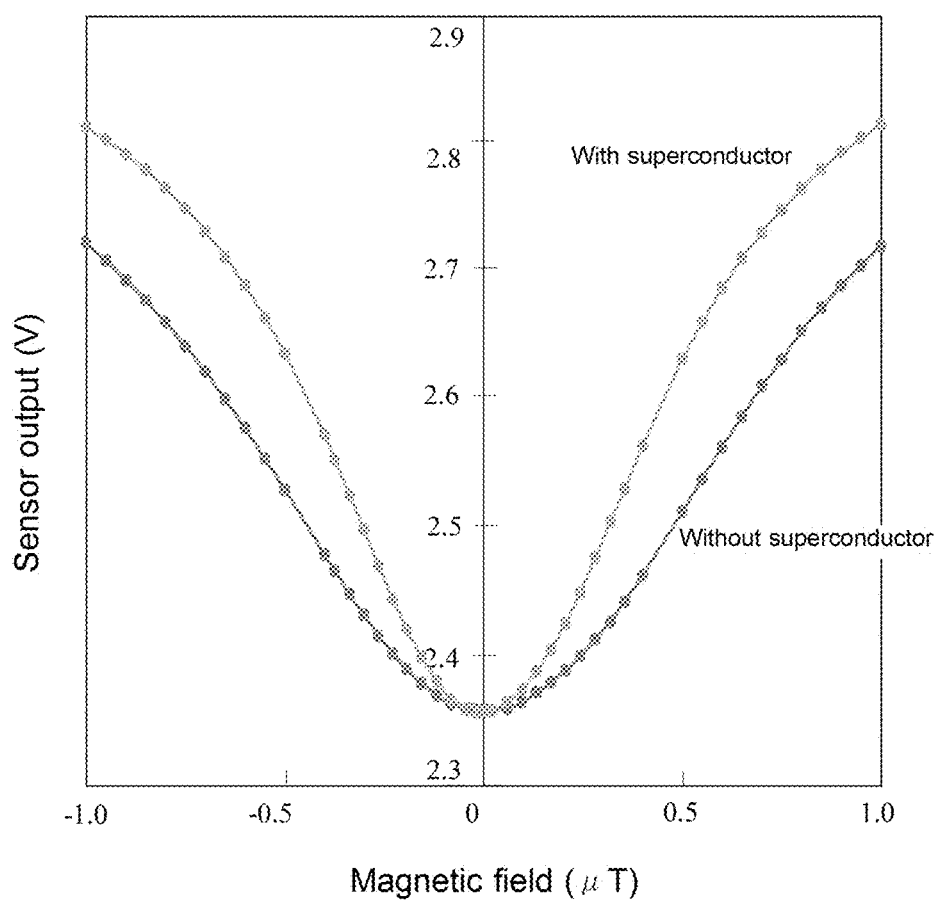
FIG. 4 is a graph representing magnetic field response characteristics in the magnetic field measuring device of the first embodiment using a TMR element as the magnetic sensor.

FIG. 4 illustrates evaluation results of magnetic field response characteristics by the same magnetic field measuring device constructed using a nano-granular tunnel magnetoresistance (TMR) element that exhibits even function characteristics with respect to the magnetic field instead of the anisotropic magnetoresistance (AMR) element. Here, the width dimension of the slit s formed in the support base a is 1.5 mm, and the magnetic field response characteristics are evaluated at the support base a at which the superconductors 2-1 in the superconducting state are provided and the support base at which the superconductors 2-1 are not provided. As is apparent from FIG. 4, it is confirmed that the support base a at which the superconductors 2-1 in the superconducting state are provided has magnetic field response characteristics steeper than the support base at which the superconductors 2-1 are not provided and the sensitivity is improved.

Figure 5:
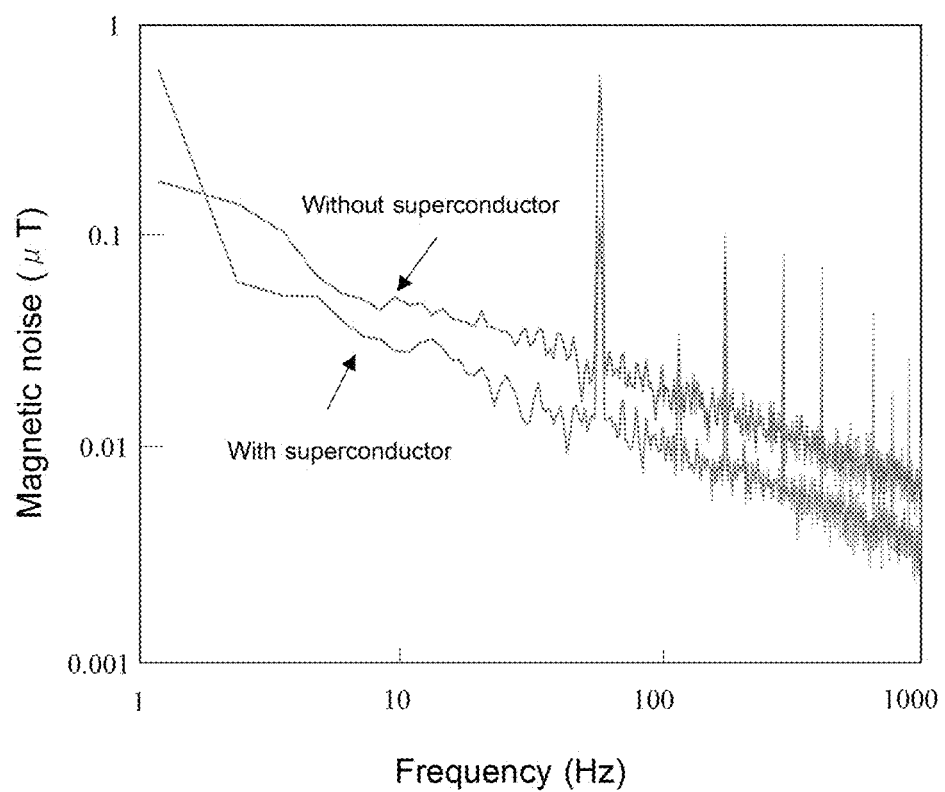
FIG. 5 is a graph representing a noise spectrum in the magnetic field measuring device according to the first embodiment using the TMR element as the magnetic sensor.

FIG. 5 illustrates a noise spectrum measured by applying a DC bias magnetic field having 500 µT in order to operate the magnetic sensor 1-1 in a linear response region in the magnetic field measuring device using the nano granular tunnel magnetoresistance (TMR) element. Even in this case, similar to the magnetic field measuring device using the anisotropic magnetoresistance (AMR) element as the magnetic sensor 1-1, it is confirmed that the magnetic field resolution is improved by using the support base a at which the superconductors 2-1 in the superconducting state are provided.

Modification Example of First Embodiment

In the magnetic field measuring device of the present invention, the magnetic field measuring device with the improved "sensitivity" and "magnetic field resolution" is used by utilizing the concentration of the magnetic flux generated by causing the superconductors to be in the superconducting state.

Figure 6:
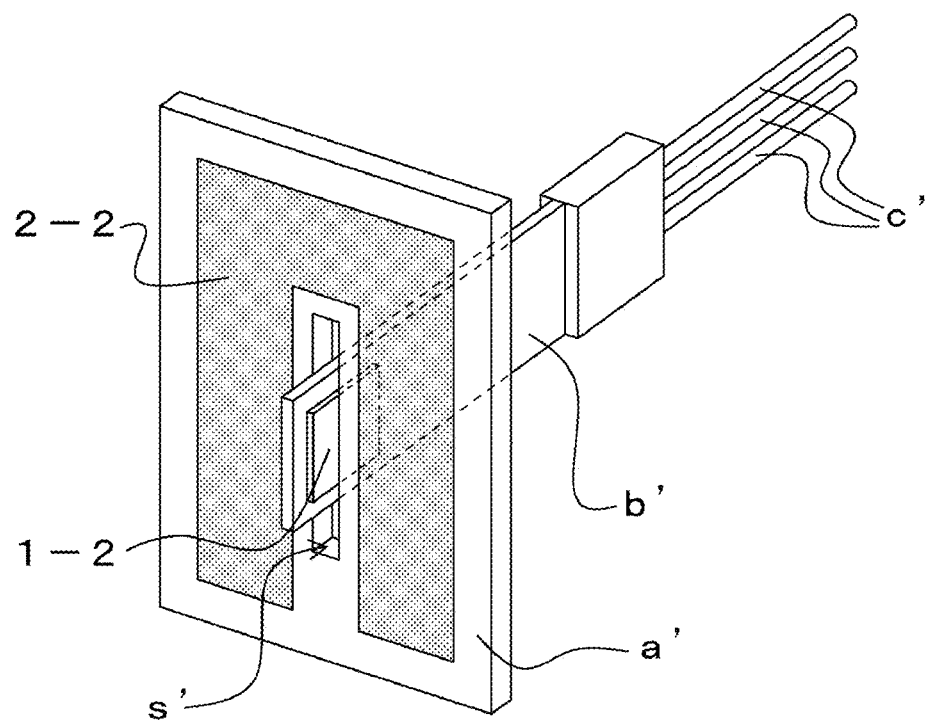
FIG. 6 is a schematic explanatory diagram of a main part of a modification example of the magnetic field measuring device according to the first embodiment.

For example, as a modification example, a magnetic field measuring device including a sensor unit which includes a magnetic sensor 1-2 and a superconductor 2-2 formed on an upper surface of a support base a' in which a slit s' into which the magnetic sensor 1-2 can be inserted is formed, as illustrated in FIG. 6. In particular, first magnetic field space forming means and second magnetic field space forming means may be formed to be opposed to each other with the slit s' formed in the support base a' interposed therebetween, and the first magnetic field space forming means and the second magnetic field space forming means may be integrated in a state in which the first magnetic field space forming means and the second magnetic field space forming means are connected above the slit s'. Even in this case, a part of the magnetic flux shielded by causing the superconductor 2-2 to be in the superconducting state concentrates on the slit s' portion, and thus, the magnetic field detected by the magnetic sensor 1-2 is improved. As a result, the sensitivity can be improved. In FIG. 6, a reference sign b' denotes a substrate b on which the magnetic sensor 1-2 is disposed, and a reference sign c' denotes a wiring connected to the substrate b'.

Second Embodiment

Although it has been described in the aforementioned first embodiment that the magnitude of the magnetic field concentrated by using the magnetic field shielding effect due to the superconducting state is measured by the magnetic sensor, a fluctuation in shielding current generated in the superconductor due to the magnetic field shielding effect is detected, and thus, it is possible to detect a fluctuation in magnetic field. In particular, in this case, it is possible to measure the magnetic field by measuring the fluctuation in shielding current generated in the superconductor as the fluctuation in magnitude of the magnetic field caused by the fluctuation in shielding current.

Figure 7:
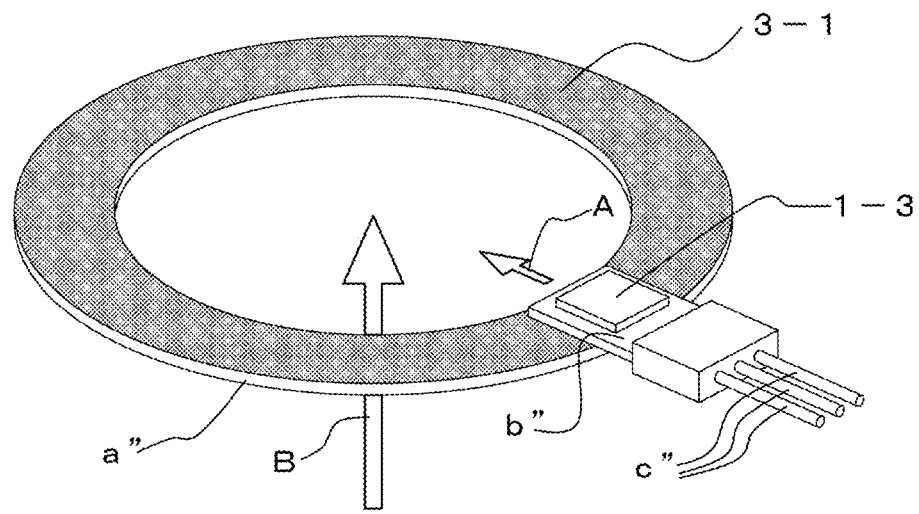
FIG. 7 is a schematic explanatory diagram of a main part of a magnetic field measuring device according to a second embodiment.

Specifically, as illustrated in FIG. 7, a sensor unit includes a superconducting coil 3-1 formed by a superconductor and a magnetic sensor 1-3 which measures the magnitude of a shielding current generated in the superconducting coil 3-1. The superconducting coil 3-1 is magnetic field space forming means.

The superconducting coil 3-1 may be formed by forming a superconductor commercially available as a linear shape in a ring shape, or a ring-shaped superconductor, that is, the superconducting coil 3-1 may be formed by forming a superconducting film on a surface of a ring-shaped circular substrate a" as illustrated in FIG. 7.

The magnetic sensor 1-3 may be any one of a Hall element, a magnetic impedance element, and a magnetoresistance element, and is disposed on an appropriate substrate b" and is connected to a measurement circuit (not illustrated) via a wiring c" connected to the substrate b". In FIG. 7, for the sake of convenience in description, since the magnetic sensor 1-3 is drawn on an upper surface of the substrate b", the substrate b" is present between the magnetic sensor 1-3 and the superconducting coil 3-1. However, the magnetic sensor 1-3 is actually disposed so as to be opposed to the superconducting coil 3-1, and the magnetic sensor 1-3 is disposed as close as possible to the superconducting coil 3-1.

The magnetic sensor 1-3 is disposed in parallel with a coil surface of the superconducting coil 3-1 toward a measurement direction of the magnetic field in a radial direction of the superconducting coil 3-1 indicated by an arrow A in FIG. 7, and thus, the fluctuation in shielding current generated in the superconducting coil 3-1 is detected. In FIG. 7, an upward arrow B indicates the measurement direction of the magnetic field using the sensor unit that includes the superconducting coil 3-1 and the magnetic sensor 1-3.

In a case where the superconducting coil 3-1 is in the superconducting state, when the magnetic flux due to the magnetic field to be measured enters the superconducting coil 3-1, since the shielding current is generated in the superconducting coil 3-1 so as to cancel the magnetic flux, the magnetic sensor 1-3 detects the fluctuation in magnetic field caused by the fluctuation in shielding current.

As described above, the superconducting coil 3-1 is in the superconducting state by disposing the magnetic sensor 1-3 with respect to the superconducting coil 3-1, and immersing the superconducting coil 3-1 and the magnetic sensor 1-3 in the container in which the liquid helium is stored. In the present embodiment, the container in which the liquid helium is stored is temperature maintaining means, and the container may store liquid nitrogen instead of the liquid helium depending on the kind of the superconducting coil 3-1 to be used, or the superconducting coil 3-1 may be in the superconducting state by using a refrigerator.

It is possible to detect the fluctuation in magnetic field caused by the fluctuation in shielding current with high sensitivity without being influenced by the magnetic field of the measurement target which influences the fluctuation in shielding current generated in the superconducting coil 3-1 by disposing the magnetic sensor 1-3 in parallel with the coil surface of the superconducting coil 3-1 toward the radial direction of the superconducting coil 3-1.

Modification Example of Second Embodiment

It has been described in the aforementioned embodiment that the magnetic field measuring device is assumed to measure an absolute magnetic field in any case. However, for example, there is also a field in which only fluctuation in geomagnetism is required to be measured with high sensitivity.

In particular, when the fluctuation in geomagnetism is detected, since the aforementioned magnetic field measuring device has too high sensitivity, the magnetic field measuring device detects not only the fluctuation in geomagnetism but also the fluctuation in magnetic field caused by other causes. Thus, it is assumed that the magnetic field measuring device cannot accurately detect desired fluctuation.

Figure 8:
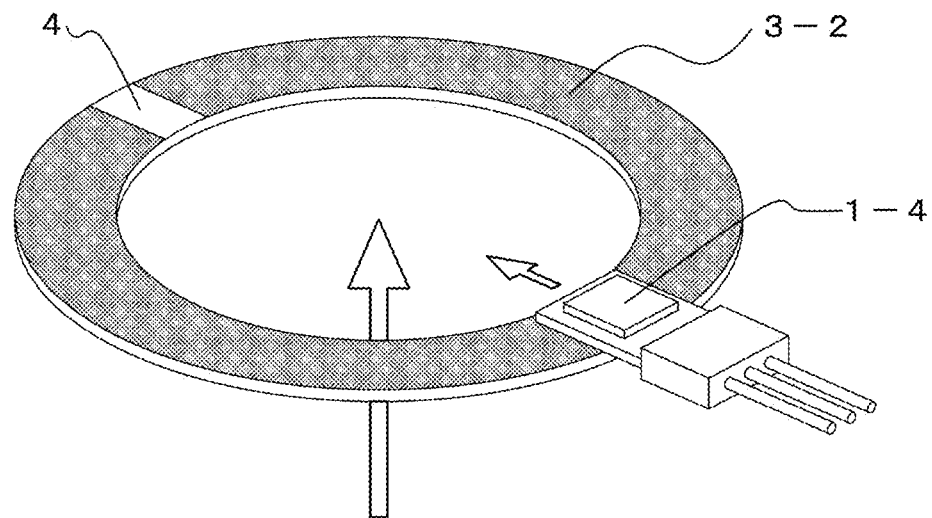
FIG. 8 is a schematic explanatory diagram of a main part of a modification example of the magnetic field measuring device according to the second embodiment.

In such a case, as in the aforementioned magnetic field measuring device of the second embodiment, when the sensor unit includes a superconducting coil 3-2 formed by the superconductor and a magnetic sensor 1-4 that measures a magnitude of a shielding current generated in the superconducting coil 3-2, since a normal conductor 4 is interposed in a part of the superconducting coil 3-2 as illustrated in FIG. 8, it is possible to perform accurate measurement. That is, when the normal conductor 4 is interposed in a part of the superconducting coil 3-2, the shielding current generated in the superconducting coil 3-2 due to resistance components of the normal conductor 4 is attenuated with a predetermined time constant, and thus, it is possible to eliminate the influence of fluctuation components other than the fluctuation in geomagnetism.

Specifically, in a case where a part of the superconducting coil 3-2 is used as the normal conductor 4, when L: self-inductance of superconducting coil 3-2
R: resistor of normal conductor 4
$\tau$ (=L/R): time constant of superconducting coil 3-2
r: radius of superconducting coil 3-2, a shielding current In(t) generated in the superconducting coil 3-2 is expressed by the following equation from a relationship between an inductance value and a resistance value of the superconducting coil 3-2.

$$I_n(t) = \frac{\pi\omega^2 B_0 r^2 \tau}{R(1+\omega^2\tau^2)}e^{-(t/\tau)} + \frac{\pi\omega B_0 r^2}{R\sqrt{1+\omega^2\tau^2}}\sin(\omega t - \theta) \quad \text{[Equation 1]}$$

Here, a phase delay $\theta$ is represented by the following equation.

$$\theta = \tan^{-1}\omega L/R \quad \text{[Equation 2]}$$

Therefore, when the phase delay $\theta$ is zero, the shielding current is the largest, and when the phase delay is $\pi/2$, the shielding current is the smallest. Here, a frequency when the phase delay is $\pi/4$ as an intermediate value is defined as a cutoff frequency.

Since the cutoff frequency is determined as a response frequency, it is possible to shield only a variable magnetic field having a frequency equal to or greater than the frequency corresponding to the time constant which is the cutoff frequency without responding to a DC magnetic field.

Therefore, it is possible to obtain signal intensity which does not depend on the frequency at the cutoff frequency or more such as superconducting characteristics, and it is possible to respond to a very low frequency of several Hz or more such as the fluctuation in geomagnetic by cutting only DC magnetic field components.

The present invention is not limited to the aforementioned embodiments, and it is needless to say that various modification examples and design changes are included in the technical scope without departing from the technical idea of the present invention.

INDUSTRIAL APPLICABILITY

In the present invention, a combined magnetic sensor in which the magnetic sensor operated at a room temperature in the related art such as the MR, MI, or the Hall element is combined with the slit or the coil formed by the superconductor is cooled and operated. Since the sensitivity can be changed depending on the width dimension of the slit and the size of the coil, it is possible to properly use the magnetic field measuring device according to applications such as geomagnetic measurement and geological exploration. In addition, when not the absolute magnetic field but only the fluctuation components are to be measured, since the response frequency can be changed by adjusting the normal conductor part of the superconducting coil, the magnetic field measuring device can be applied in a wide range of fields such as a non-destructive inspection device that measures the fluctuation component of the geomagnetism or inspects metal defects.

REFERENCE SIGNS LIST 1-1 magnetic sensor
1-2 magnetic sensor
1-3 magnetic sensor
1-4 magnetic sensor
2-1 superconductor
2-2 superconductor
3-1 superconducting coil
3-2 superconducting coil
4 normal conductor

The invention claimed is:

1. A magnetic field measuring device comprising:
temperature maintaining means for maintaining a very low temperature state in which a superconductor is in a superconducting state;
a magnetic sensor that is provided within the temperature maintaining means to detect a magnetic field; and
magnetic field space forming means for forming a magnetic field space specific to the superconducting state by causing the superconductor to be in the superconducting state within the temperature maintaining means,
wherein the magnetic sensor is disposed within the magnetic field space,
wherein the magnetic sensor is disposed between first magnetic field space forming means and second magnetic field space forming means,
wherein the magnetic field measuring device includes a base having a slit which allows the magnetic sensor to be inserted, and the first magnetic field space forming means and the second magnetic field space forming means are provided with the slit interposed there between.

2. The magnetic field measuring device according to claim 1, wherein the first magnetic field space forming means and the second magnetic field space forming means are integrated on the base.

3. The magnetic field measuring device according to claim 1, wherein the magnetic sensor is any one of a Hall element, a magnetic impedance element, and a magnetoresistance element.

4. The magnetic field measuring device,
wherein the temperature maintaining means for maintaining the very low temperature state in which the superconductor is in the superconducting state,
the magnetic sensor that is provided within the temperature maintaining means to detect the magnetic field; and
the magnetic field space forming means for forming the magnetic field space specific to the superconducting state by causing the superconductor to be in the superconducting state within the temperature maintaining means,
wherein the magnetic sensor is disposed within the magnetic field space,
wherein the magnetic field space forming means is a superconducting coil, and the magnetic sensor measures a magnetic field generated by a shielding current generated in the superconducting coil,
wherein the magnetic sensor is disposed so as to be opposed to the superconducting coil which is formed as a ring-shaped circular substrate, and a normal conductor is disposed on the base.

* * * * *